(12) United States Patent
Pracht et al.

(10) Patent No.: US 7,449,912 B2
(45) Date of Patent: Nov. 11, 2008

(54) FAULT DETECTION CIRCUIT

(75) Inventors: Kelly Jean Pracht, Fort Collins, CO (US); Samuel M. Babb, Fort Collins, CO (US); Jack Lavier, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 119 days.

(21) Appl. No.: 11/627,730

(22) Filed: Jan. 26, 2007

(65) Prior Publication Data

US 2008/0180108 A1 Jul. 31, 2008

(51) Int. Cl.
*G01R 31/36* (2006.01)

(52) U.S. Cl. .................... 324/771; 324/118; 324/521

(58) Field of Classification Search .......... None
See application file for complete search history.

(56) References Cited

U.S. PATENT DOCUMENTS 5,689,394 A * 11/1997 Esser et al. .............. 361/56
2008/0012542 A1 * 1/2008 Liu et al. ................. 323/271

* cited by examiner

*Primary Examiner*—Minh N Tang

(57) ABSTRACT

Power supplies are disclosed herein. One embodiment of a power supply comprises a first input and a second input, wherein the first input and the second input are connectable to a pulse width modulation controller and wherein a pulse width modulation signal is outputable from the pulse width modulation controller. A power stage connected to the first input and the second input. A first comparator having a first comparator first input is connected to the first input and a first comparator second input connected to the output of the power stage. A change of voltage at the output of the first comparator constitutes a difference in phase between the first input and the output of the power stage.

18 Claims, 3 Drawing Sheets

FAULT DETECTION CIRCUIT

BACKGROUND

Some DC to DC converters use devices, such as MOSFETs, controlled by a pulse width modulation controller to generate a DC voltage. A fault in the converter may damage a device using that DC voltage or render the device unusable. Current methods detect faults at the filtered DC output voltage rather than within the DC-DC converter itself. In order to protect the devices using the DC voltage, or to achieve improved fault tolerance in systems, faster detection of faults in the DC-DC converter is required.

DETAILED DESCRIPTION

Figure 1:
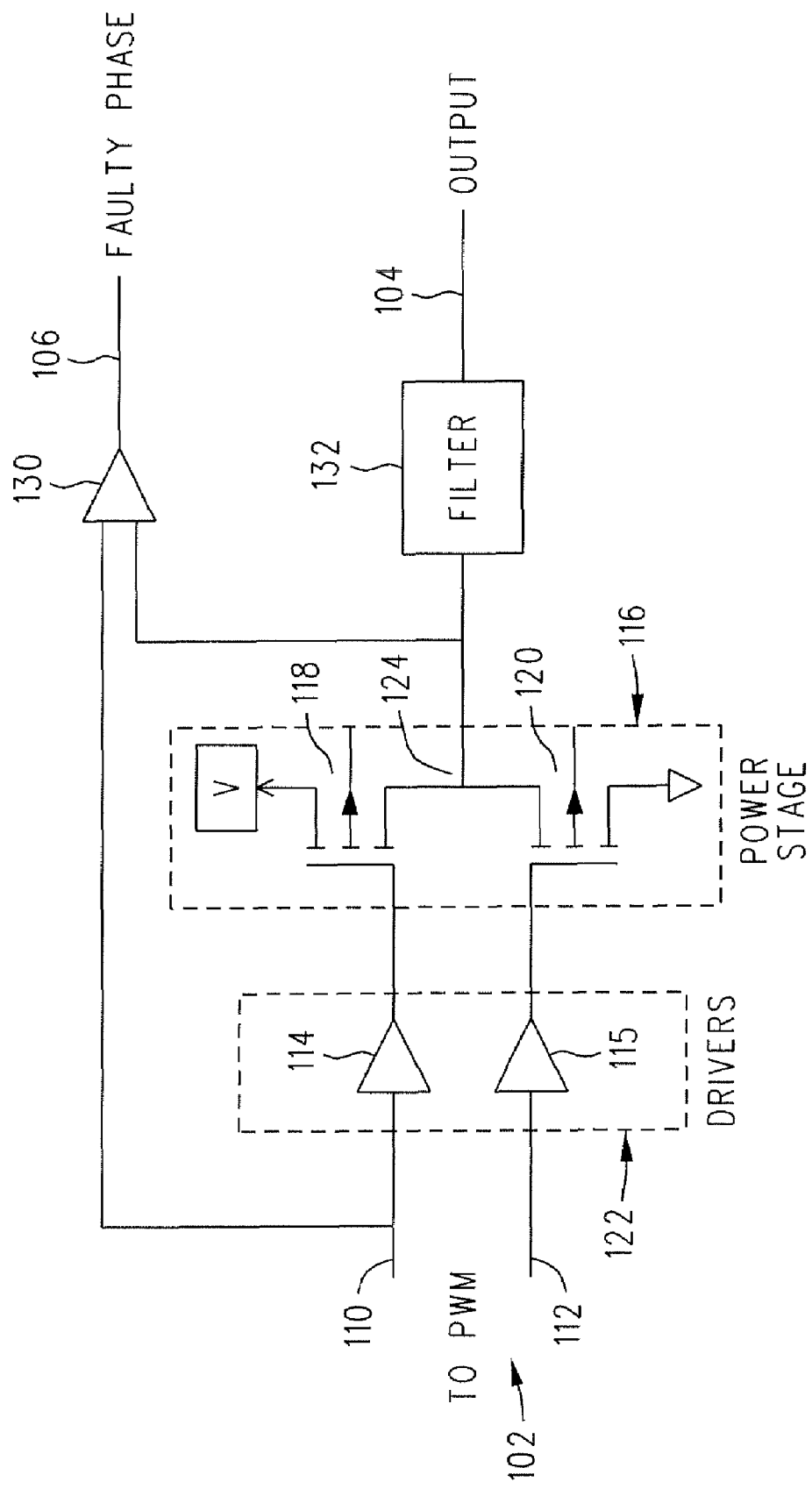
FIG. 1 is a schematic drawing of an embodiment of a power supply circuit including a fault detection circuit.

An embodiment of a portion of a power supply circuit 100, including fault detection, is schematically shown in FIG. 1. The circuit 100 includes an input 102, an output 104, and a fault output 106. The input 102 includes a first input 110 and a second input 112 that are pulse width modulated signals. With this regard, signals input at the first input 110 may have a first duty cycle D. Signals input at the second input 112 may have a second duty cycle that is the inverse of the first duty cycle or 1-D.

The pulse width modulated signals 110 and 112 connect to drivers 114 and 115, respectively. The drivers 114, 115 may be MOSFET drivers. MOSFETS 118, 120, which may be switching MOSFETs, are controlled by the drivers 114, 115 and are switch ON and OFF to generate a third duty cycle at a node 124. The voltages at the node 124 vary between ground and an input voltage V. The voltage at the node 124 is filtered by a filter 132 and an average output voltage is realized at an output 104. This average voltage at the output is approximately or proportional to the product of the duty cycle D and the input voltage of the gate of the MOSFET 118.

As described in greater detail below, the fault output 106 provides an indication of a fault at the output 104. A device using the circuit 100 may change its operation based on the fault.

Having described the external connections of the circuit 100, the internal components will now be described. The input 102 is connected to a driver stage 122. The driver stage 122 includes the drivers 114, 115. The drivers 114, 115 condition the pulse width modulation signals 110, 112 so as to drive the MOSFETs 118, 120. The outputs of the driver stage 122 are applied to the gates of the MOSFETS 118 and 116.

In the embodiment of the power stage 116 described herein, a first input is connected to the gate of the MOSFET 118. Likewise, a second input is connected to the gate of the MOSFET 120. The source of the MOSFET 118 is connected to the drain of the MOSFET 120. This connection is referred to as the phase node 124 and the voltage of the phase node 124. It is to be noted that switching devices other than MOSFETs may be used in the power stage 116.

Both the phase node 124 and the first input 110 are connected to a comparator 130. The comparator 130 serves to compare the phase of the phase node to the phase of the first input 110. It is noted that the comparator 130 is a comparison circuit and the terms comparator and comparison circuit may be used interchangeably. The output of the comparator 130 is the fault output 106. The comparator 130 outputs a first voltage if the phases are the same and a second voltage of the phases are different. Thus, a device may monitor the fault output 106 of the comparator 130 to determine if the voltage at the output 104 is improper. If a fault occurs with the power stage 116 of the phases of the pulse width modulation signal, the fault output will transition to the second voltage. More specifically, the comparator 130 will determine if the duty cycle at the input 110 is substantially similar to the duty cycle at the node 124.

In some embodiments, a delay circuit (not shown in FIG. 1) may be connected to the circuit 100 before or after the comparator 130 to account for known timing differences associated with the driver 114 and to prevent incorrect fault signals. In some embodiments, a latch circuit may be implemented to latch the fault signal. Other embodiments may include a second comparator that compares the phase of the second input 112 to the phase of the phase node 124 in a similar manner as the comparator 130 functions.

In the embodiment of the circuit 100 of FIG. 1, a filter 132 is connected between the phase node 124 and the output 104. The filter 132 serves to perform an averaging function of the phase node 124 to produce a DC voltage output 104.

Figure 2:
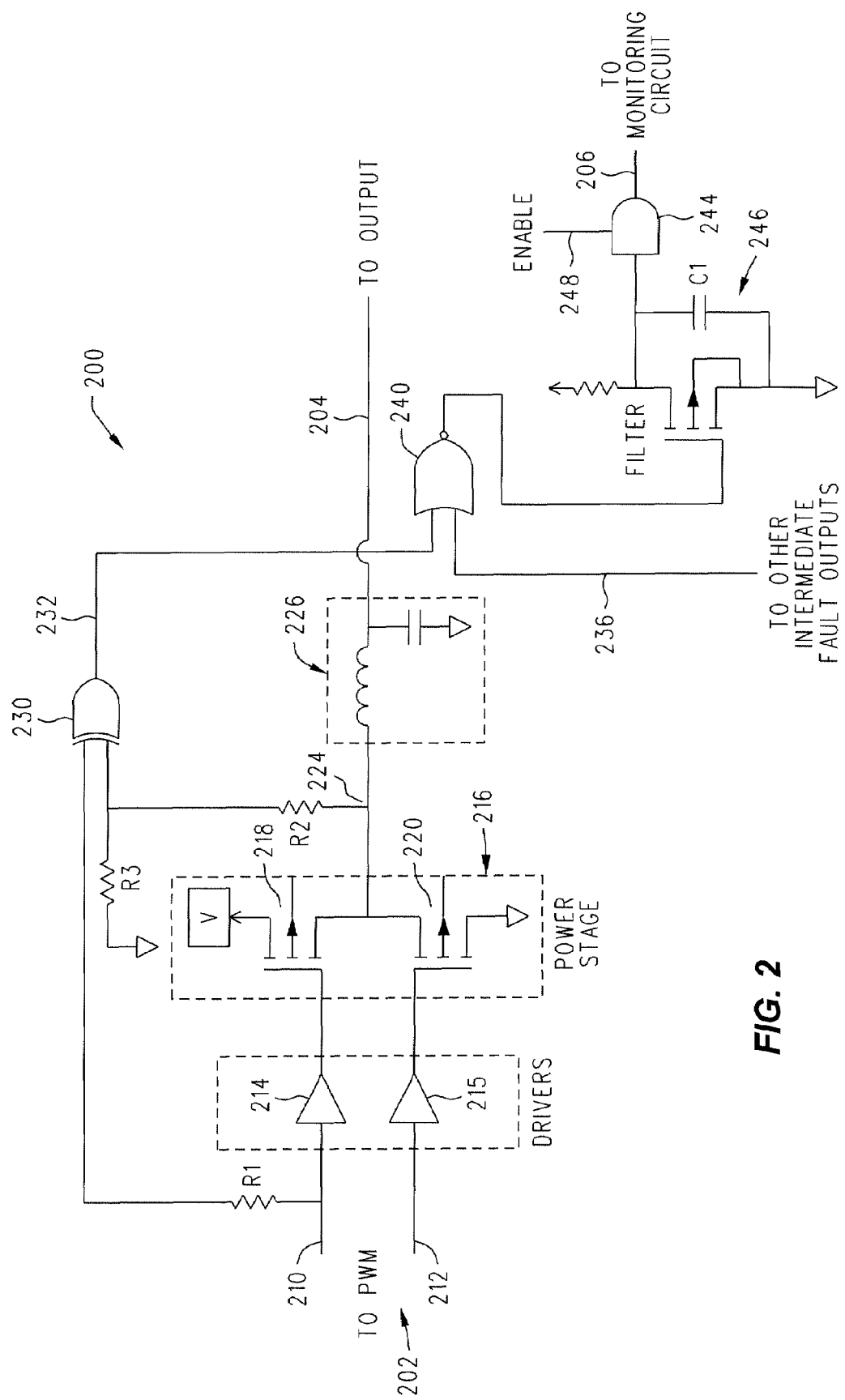
FIG. 2 is a schematic drawing of another embodiment of a power supply circuit including a fault detection circuit.

Another embodiment of power supply circuit 200, including a fault detection circuit, is shown in FIG. 2. As with the circuit 100 of FIG. 1, the circuit 200 includes an input 202, and output 204, and a fault output 206. In the embodiment of the circuit 200, the input 202 is connectable to a pulse width modulation controller. Accordingly, the input 202 includes a first input 210 and a second input 212. The voltage on the first input 210 may have a first duty cycle of D and the voltage on the second input 212 may have a second duty cycle of 1-D.

The first input 210 is connected to a first driver 214 and the second input is connected to a second driver 215. The outputs of the drivers 214, 215 are connected to a power stage 216 as described in FIG. 1. The power stage 216 includes a first FET 218 and a second FET 220, which may be identical to the FETs 118, 120 described in FIG. 1. The output of the first driver 214 is connected to the gate of the first FET 218 and the output of the second driver 215 is connected to the gate of the second FET 220. The source of the first FET 218 is connected to the drain of the second FET 220 at the phase node 224. A filter that averages the pulse width modulation component of the voltage at the phase node 224 is connected between the phase node 224 and the output 204. In the embodiment of the circuit 200, the filter 226 includes an inductor and a capacitor.

The comparing circuit of the circuit 200 is an exclusive OR gate (XOR gate) 230. A first input of the XOR gate 230 is connected to the first input by way of a first resistor R1. The second input of the XOR gate 230 is connected to the phase node 224 by way of a second resistor R2. A pull down resistor R3 is connected between the second input of the XOR gate 130 and ground. The resistor R3 serves as one embodiment of a voltage divider to present proper voltage levels to the XOR device where necessary. If a difference between the phase of the input 202 and the phase node 224 occurs, the output of the XOR gate 230 will transition from a low voltage to a high voltage. The output of the XOR gate 230 is referred to as the intermediate fault output 232.

Other power supplies may be used by the device using the power supply of the circuit 200. In order to monitor these other supplies, other intermediate fault outputs 236 may be connected to a second comparison circuit, which in FIG. 2, is the NOR gate 240. If the phases of all the other power supplies are operating properly, they will all input low voltages to the NOR gate 240, which causes the NOR gate 240 to output a high voltage. If any of the phases fail, the NOR gate 240 will output a low voltage during the period of the phase failure. This low voltage output of the NOR gate 240 may be processed by a device in order to respond to the power or phase failure.

Because the output of the NOR gate 240 remains low during the phase error, it may not remain low long enough to be processed. In other situations, the error may not be able to be processed until several phase or power failures are detected. In other situations, there is an inherent delay between the PWM node 210 and the phase node 224 caused by transition times through the drivers 214 and 215 and the power stage 220. In order to overcome these problems, filtering may be required. In the embodiment of the circuit shown in FIG. 2, the output of the NOR gate 240 is connected to the filter 246. An inverted and delayed signal is input to a latch element 244 as described below.

The low output of the NOR gate 240 triggers the latch device 244 as described below. In the non-limiting embodiment described herein, the output of the NOR gate 240 is first output to the filter 246 that inverts the voltage. As shown in FIG. 2, when the voltage at the output of the NOR gate 240 transitions low, a capacitor C1 charges, causing a high voltage at the input of the latch element 244. Accordingly, the output of the latch element 244 transitions high and is maintained high. It is noted that in the embodiment of the circuit 200, an enable line may be input to the latch element 244. In such embodiments, the output of the latch element 244 will only transition high when the enable line is high. In other embodiments, other filter mechanisms and latch elements may be implemented.

The embodiment of circuit 200 causes the fault output 206 to remain high after a fault is detected. Keeping the voltage high better enables a device relying on the output 204 to respond to a power failure.

Figure 3:
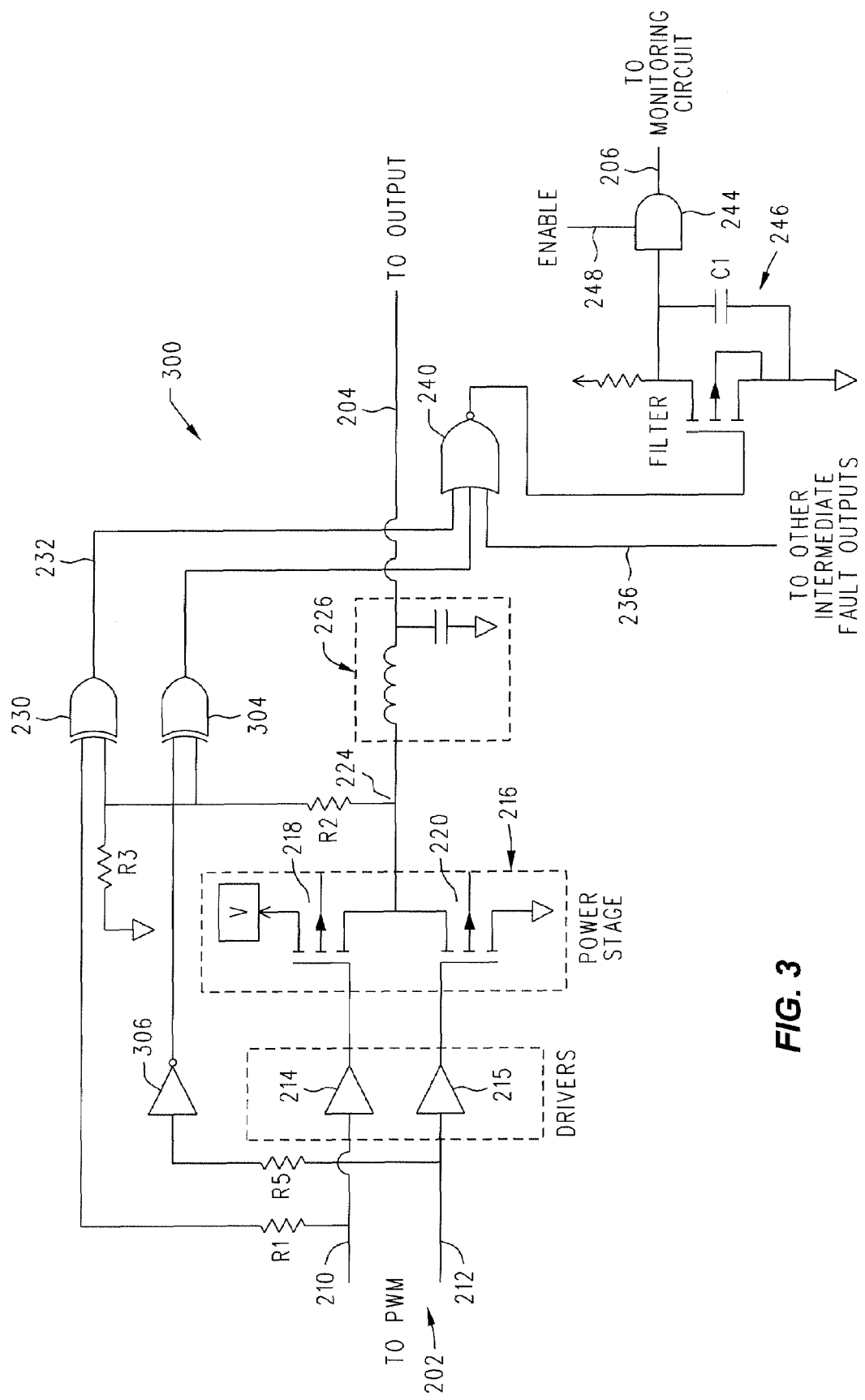
FIG. 3 is a schematic drawing of another embodiment of a power supply circuit including a fault detection circuit.

A more complex circuit 300 is illustrated in FIG. 3. The circuit 300 compares both phases of the phase width modulation controller to the phase node rather than comparing a single phase to the phase node. The circuit 300 is similar to the circuit 200 of FIG. 2, and additionally includes an exclusive OR gate 304, an inverter 306, and a resistor R5. One input of the XOR gate 304 is connected to the second input 212 by way of the resistor R5 and the inverter 306. The other input is connected to the phase node 224.

The XOR gate 304 serves to compare the phase of the second input 212 to the phase node 224 in the same way the XOR gate 230 compares the phase of the first input 210 to the phase node 224. The XOR gate 230 is connected to the second input 212 by way of the inverter 306 because the phase of the phase node 224 is inverted from the phase of the second input. The output of the XOR gate 304 is input to the NOR gate 240 in the same manner as other phase inputs. Thus, failure of the phase at either the first input 210 or the second input 212 will cause the voltage output by the NOR gate 240 to transition as described above. Devices may monitor the fault output 206 as described above to process the voltage failure.

It is noted that other components may be included in the circuit 300 and the circuit 200 of FIG. 2 to enhance the operation. However, the function of monitoring the phases remains the same.

What is claimed is:

1. A power supply comprising:
   a first input;
   a second input, wherein said first input and said second input are connectable to a pulse width modulation controller, wherein a pulse width modulation signal is outputable from said pulse width modulation controller;
   a power stage connected to said first input and said second input, said power stage having an output;
   a first comparator having a first comparator first input connected to said first input and a first comparator second input connected to said output of said power stage, wherein a change of voltage at the output of said first comparator constitutes a difference in phase between said first input and said output of said power stage.

2. The power supply of claim 1, wherein said first comparator is an exclusive OR gate.

3. The power supply of claim 1 and further comprising a sample and hold circuit connected to said output of said first comparator.

4. The power supply of claim 1 and further comprising a second comparator having a second comparator first input connected to said second input and a second comparator second input connected to said output of said power stage, wherein a change of voltage at the output of said second comparator constitutes a difference in phase between said second input and said output of said power stage.

5. The power supply of claim 4 and further comprising a third comparator wherein said output of said first comparator and said output of said second comparator are connected to inputs of said third comparator; and wherein a voltage transition of either said output of said first comparator or the output of said second comparator causes a voltage transition at the output of said third comparator.

6. The circuit of claim 5, wherein said third comparator is a gate.

7. The circuit of claim 5 and further comprising a sample and hold circuit connected to the output of said third comparator.

8. A power supply comprising:
   a first input;
   a second input, wherein said first input and said second input are connectable to a pulse width modulation controller, wherein a pulse width modulation signal is outputable from said pulse width modulation controller;
   a power stage connected to said first input and said second input, said power stage having an output;
   a first gate, wherein a first input of said first gate is connected to said first input, wherein a second input of said first gate is connected to said output of said power stage, wherein a voltage transition at the output of the first gate represents a fault with the power supply.

9. The power supply of claim 8, wherein said first gate is an exclusive NOR gate.

10. The power supply of claim 8 and further comprising a second gate, wherein a first input of said second gate is connected to said second input, wherein a second input of said second gate is connected to said output of said power stage, wherein a voltage transition at the output of the second gate represents a fault with the power supply.

11. The power supply of claim 10 and further comprising an inverter connected between said second input and said first input of said second gate.

12. The power supply of claim 10, wherein said second gate is an exclusive NOR gate.

13. The power supply of claim 10 and further comprising a third gate, wherein a first of input of said third gate is connected to said output of said first gate, wherein a second input of said third gate is connected to said output of said second gate, and wherein a voltage transition at the output of said third gate represents a fault with said power supply.

14. The power supply of claim 13, wherein said third gate is a NOR gate.

15. The power supply of claim 13 and further comprising a sample and hold circuit connected to said output of said third gate.

16. A method of detecting a fault in a pulse width modulation type power supply, wherein said power supply is connectable to a pulse width modulation controler and wherein said pulse width modulation signal is connected to a power stage, said method comprising:

comparing the phase of a first input from the pulse width modulation controller to the output of the power stage; and outputting a first voltage if the phase of said first input differs from the phase of said output of said power stage.

17. The method of claim 16 and further comprising:

comparing the phase of a second input from the pulse width modulation controller to the output of the power stage; and outputting a second voltage if the phase of said second input differs from the phase of said output of said power stage.

18. The method of claim 17 and further comprising outputting a third voltage if either said first voltage or said second voltage is output.

* * * * *

UNITED STATES PATENT AND TRADEMARK OFFICE
CERTIFICATE OF CORRECTION

| | | |
|---|---|---|
| PATENT NO. | : 7,449,912 B2 | Page 1 of 1 |
| APPLICATION NO. | : 11/627730 | |
| DATED | : November 11, 2008 | |
| INVENTOR(S) | : Kelly Jean Pracht et al. | |

It is certified that error appears in the above-identified patent and that said Letters Patent is hereby corrected as shown below:

In column 5, line 8, in Claim 16, delete "controler" and insert -- controller --, therefor.

Signed and Sealed this

Fourteenth Day of April, 2009

JOHN DOLL
*Acting Director of the United States Patent and Trademark Office*